United States Patent
Chang et al.

(10) Patent No.: US 9,773,821 B2
(45) Date of Patent: Sep. 26, 2017

(54) DISPLAY APPARATUS

(71) Applicant: E Ink Holdings Inc., Hsinchu (TW)

(72) Inventors: Chun-Wei Chang, Hsinchu (TW); Pei-Lin Huang, Hsinchu (TW); Kun-Lung Huang, Hsinchu (TW); Wu-Liu Tsai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/983,579

(22) Filed: Dec. 30, 2015

(65) Prior Publication Data

US 2016/0307921 A1    Oct. 20, 2016

(30) Foreign Application Priority Data

Apr. 17, 2015    (TW) .............................. 104112431 A

(51) Int. Cl.
| | |
|---|---|
| *H01L 27/14* | (2006.01) |
| *H01L 29/04* | (2006.01) |
| *H01L 27/15* | (2006.01) |
| *H01L 23/48* | (2006.01) |
| *H01L 27/12* | (2006.01) |
| *G02F 1/167* | (2006.01) |

(52) U.S. Cl.
CPC ............ *H01L 27/124* (2013.01); *G02F 1/167* (2013.01)

(58) Field of Classification Search
CPC ............... H01L 27/124; H01L 27/1218; H01L 27/1248; H01L 27/0288; H01L 27/0296; G02F 1/167
USPC ........ 257/72, 59, 344, 79, 642, 773, E33.05, 257/E21.535; 438/151, 30, 34; 349/46
See application file for complete search history.

(56) References Cited

U.S. PATENT DOCUMENTS

| | | | |
|---|---|---|---|
| 6,801,288 B1* | 10/2004 | Ashizawa | G02F 1/134363 349/143 |
| 8,410,484 B2 | 4/2013 | Park et al. | |
| 2002/0021375 A1* | 2/2002 | Nakajima | G02F 1/136204 349/40 |
| 2003/0020845 A1* | 1/2003 | Lee | G02F 1/136204 349/40 |

(Continued)

FOREIGN PATENT DOCUMENTS

| | | |
|---|---|---|
| CN | 1151026 A | 6/1997 |
| CN | 101105618 A | 1/2008 |

(Continued)

OTHER PUBLICATIONS

Corresponding Taiwanese Office Action that these art references were cited on Mar. 9, 2016.

*Primary Examiner* — Dzung Tran
(74) *Attorney, Agent, or Firm* — CKC & Partners Co., Ltd.

(57) ABSTRACT

A display apparatus includes a light permeable substrate, dummy pixels, a peripheral wiring layer and a display element layer. The dummy pixels are disposed on the light permeable substrate. Each of the dummy pixels includes a dummy pattern controlling layer. The peripheral wiring layer is disposed on the light permeable substrate for applying voltages having the same polarity to the dummy pattern controlling layers. The display element layer covers the light permeable substrate and the dummy pixels. The peripheral wiring layer and the dummy pattern controlling layer are spaced apart by a gap. The gap allows light to be reflected from the display element layer to the light permeable substrate.

11 Claims, 6 Drawing Sheets

(56) References Cited

U.S. PATENT DOCUMENTS

| | | | |
|---|---|---|---|
| 2003/0155612 A1 | 8/2003 | Kawachi et al. | |
| 2008/0079859 A1* | 4/2008 | Ota | G02F 1/136204 349/40 |
| 2008/0158143 A1 | 7/2008 | Kim et al. | |
| 2008/0192163 A1 | 8/2008 | Lee et al. | |
| 2010/0123869 A1* | 5/2010 | Itakura | G02F 1/136204 349/143 |
| 2012/0326148 A1* | 12/2012 | Ko | H01L 22/14 257/49 |
| 2014/0240889 A1 | 8/2014 | Zheng | |

FOREIGN PATENT DOCUMENTS

| | | |
|---|---|---|
| JP | 2013044905 A | 3/2013 |
| TW | 200841103 A | 10/2008 |
| TW | 200937089 A | 9/2009 |

\* cited by examiner

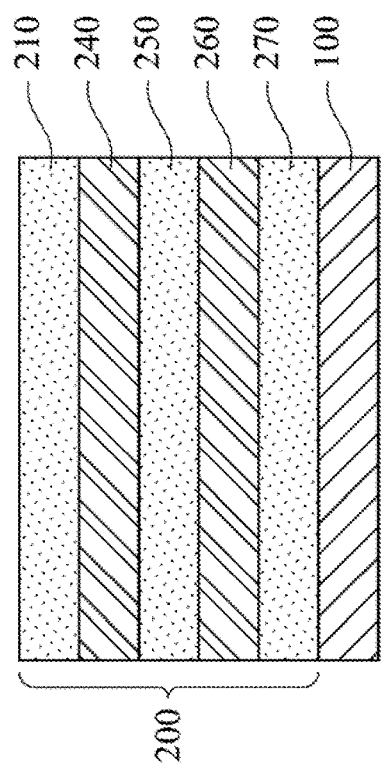
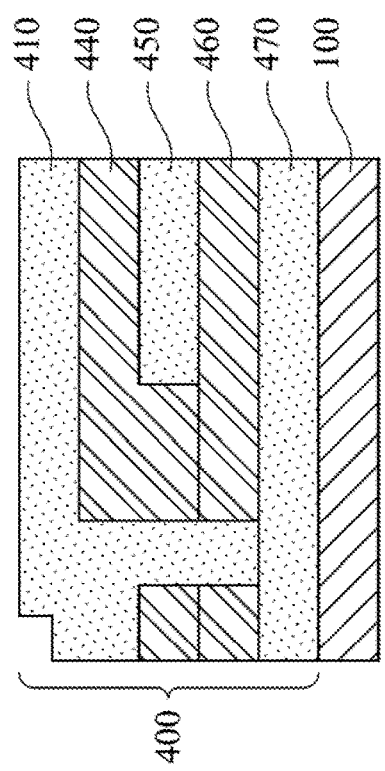
Fig. 4
Fig. 3

DISPLAY APPARATUS

RELATED APPLICATIONS

This application claims priority to Taiwanese Application Serial Number 104112431, filed Apr. 17, 2015, which is herein incorporated by reference.

BACKGROUND

Technical Field

Embodiments of the present invention relate to a display apparatus. More particularly, embodiments of the present invention relate to a display apparatus of which a damage location can be observed.

Description of Related Art

A typical electrophoretic display apparatus includes an electrophoretic layer and a thin film transistor (TFT) array substrate. The electrophoretic layer is disposed on the TFT array substrate. During operation, the TFT array substrate generates an electric field to control the movements of white charged particles and black charged particles in the microcapsules of the electrophoretic layer, so as to show an image.

The TFT array substrate includes display pixels and dummy pixels. The dummy pixels surround the display pixels, and enable an outmost annular zone of a display element layer to show the same color, thus forming a visual frame.

Generally speaking; when a wire in the TFT array substrate is damaged, the damaged wire can be determined by observing colors of the microcapsules from a rear surface of a glass substrate. However, in order to make the outmost annular zone look like a continuous frame-shaped pattern, a continuous annular metal electrode is disposed under the outmost annular zone, so as to control all microcapsules in the outmost annular zone. In such a configuration, because the metal electrode intervenes between the display element layer and the glass substrate, the microcapsules of the display element layer cannot be observed from the rear surface of the glass substrate when a wire in the TFT array substrate is damaged, the damaged wire cannot be determined by observing the microcapsules from the rear surface of the glass substrate.

SUMMARY

Embodiments of the present invention provide a display apparatus of which a damage position can be observed.

In accordance with one embodiment of the present invention, a display apparatus includes a light permeable substrate, dummy pixels, a peripheral wiring layer and a display element layer. The dummy pixels are disposed on the light permeable substrate. Each of the dummy pixels includes a dummy pattern controlling layer. The peripheral wiring layer is disposed an the light permeable substrate and is configured to apply voltages having the same polarity to the dummy pattern controlling layers. The display element layer covers the light permeable substrate and the dummy pixels. The peripheral wiring layer and the dummy pattern controlling layers are spaced apart by a gap, and the gap allows a light to be reflected from the display element layer to the light permeable substrate.

In the foregoing embodiment, because the peripheral wiring layer located beside the dummy pixels are spaced apart by the gap, and the gap allows the light to be reflected by the display element layer to the light permeable substrate, an inspector can see the display element layer located above the gap from a rear surface of the light permeable substrate, such that colors of the microcapsules in the display element layer can be observed to determine a damage location of the display apparatus based on abnormal or different colors of the microcapsules.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 3 is a schematic cross-sectional view of the thin film transistor array substrate taken along line 3-3 shown in FIG. 2;

FIG. 4 is a schematic cross-sectional view of the thin film transistor array substrate taken along line 4-4 shown in FIG. 2;

DETAILED DESCRIPTION

Figure 1:
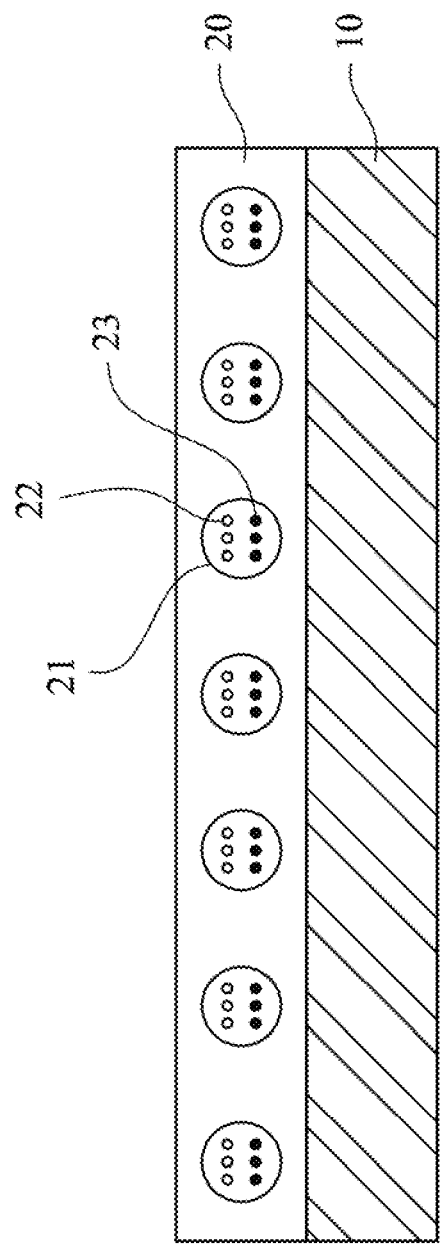
FIG. 1 is a schematic cross-sectional view of a display apparatus in accordance with one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic cross-sectional view of a display apparatus in accordance with one embodiment of the present invention. As shown in FIG. 1, the display apparatus includes a thin film transistor array substrate 10 and a display element layer 20. The display element layer 20 is disposed on the thin film transistor array substrate 10 and is driven by the thin film transistor array substrate 10 to show an image. For example, the display element layer 20 can be an electrophoretic layer, which includes microcapsules 21. Each of the microcapsules 21 includes light-colored charged particles 22 and a plurality of dark-colored charged particles 23. The light-colored charged particles 22 and the dark-colored charged particles 23 have charges of different types, and can be attracted or repulsed by the electric field of the thin film transistor array substrate 10, so as to be moved to a predetermined position to show an image.

Figure 2:
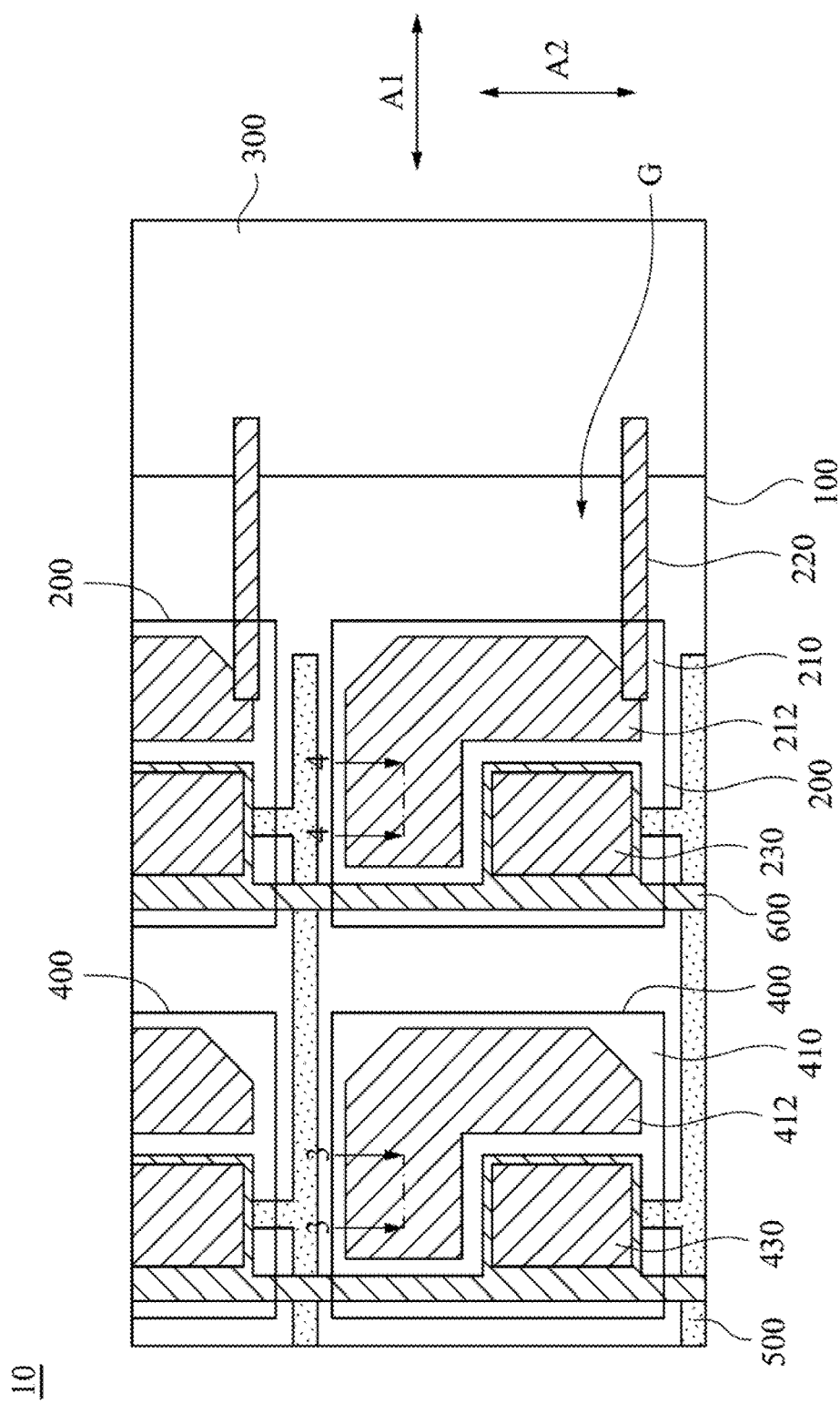
FIG. 2 is a schematic fragmentary top view of a thin film transistor array substrate in accordance with one embodiment of the present invention.

FIG. 2 is a schematic fragmentary top view of the thin film transistor array substrate 10 in accordance with one embodiment of the present invention. As shown in FIG. 2, the thin film transistor array substrate 10 includes a light permeable substrate 100, dummy pixels 200, a peripheral wiring layer 300, a display element layer 400, data lines 500 and scan lines 600. The dummy pixels 200 the peripheral wiring layer 300 and the display pixels 400 are disposed on the light permeable substrate 100. The dummy pixels 200 surround the display pixels 400, and the peripheral wiring layer 300 surrounds the dummy pixels 200. In other words, the dummy pixels 200 cooperatively form an annular pattern, which surrounds all display pixels 400. The peripheral wiring layer 300 forms an annular pattern as well, which surrounds all the dummy pixels 200. The data lines 500 and the scan lines 600 are configured to drive the display pixels 400 to show an image. At least two of the display pixels 400 are applied with voltages having different polarities, so that the microcapsules 21 of the display element layer 20 (see FIG. 1) show different colors to show a particular image.

As shown in FIG. 2, each dummy pixel 200 includes a dummy pattern controlling layer 210. The dummy pattern controlling layer 210 is electrically connected to the peripheral wiring layer 300. The peripheral wiring layer 300 is configured to apply voltages having the same polarity to the dummy pattern controlling layers 210 of all dummy pixels 200, so that all microcapsules 21 of the display element layer 20 (See FIG. 1) show the same color, thereby forming a continuous frame-like pattern.

As shown in FIG. 2, the peripheral wiring layer 300 and the dummy pattern controlling layers 210 of all dummy pixels 200 are spaced apart by a gap G. The display element layer 20 (See FIG. 1) covers the light permeable substrate 100, the dummy pixels 200 and the display pixels 400, and a portion of the display element layer 20 is located above the gap G. The gap G allows a light to be reflected from the display element layer 20 to the light permeable substrate 100. As a result, an inspector can see the display element layer 20 located above the gap G from the rear surface of the light permeable substrate 100 (namely, the surface opposite to the dummy pixels 200, the peripheral wiring layer 300 and the display pixels 400), so that the color of the microcapsules 21 of the display element layer 20 located above the gap G can be observed from the rear surface of the light permeable substrate 100, and the damage or defect location can be determined by using the different or abnormal colors of the microcapsules 21.

In some embodiments, as shown in FIG. 2, the dummy pixel 200 includes an electrical connection structure 220. The electrical connection structure 220 passes through the gap G and connects the dummy pattern controlling layer 210 and the peripheral wiring layer 300. As such, the peripheral wiring layer 300 applies a voltage to the dummy pattern controlling layer 210 via the electrical connection structure 220, so as to control the microcapsules 21 of the display element layer 20 (See FIG. 1) located above the dummy pixels 200 to show the same color, thereby forming a continuous frame-like pattern.

In order to allow the light to pass through the gap G and be reflected from the display element layer 20 to the light permeable substrate 100, the electrical connection structure 220 exposes a portion of the gap G. In such a configuration, even though the electrical connection structure 220 passes through the gap G to electrically connect the dummy pattern controlling layer 210 and the peripheral wiring layer 300, the inspector still can observe the color of the microcapsules 21 located above the gap G from the rear surface of the light permeable substrate 100, thereby determining the damage or defect location by using the different or abnormal colors of the microcapsules 21.

Moreover, because the electrical connection structure 220 passes through the gap G, and a portion of the display element layer 20 is located above the gap G, this portion of the display element layer 20 located above the gat G can be controlled by the electric field of the electrical connection structure 220 when the peripheral wiring layer 300 applies a voltage to the electrical connection structure 220. Further, because the electrical connection structure 220 and the dummy pattern controlling layer 210 are applied with the same voltage, the portion of the display element layer 20 located above the gap G and the portion of the display element layer 20 located above the dummy pattern controlling layer 210 can show the same color, thereby forming a continuous frame-like pattern.

In some embodiments, as shown in FIG. 2, the portion of the display element layer 20 (See FIG. 1) located above the dummy pixel 200 is controlled by the electric field of the dummy pattern controlling layer 210. The dummy pixel 200 may include a thin film transistor 230. The dummy pattern controlling layer 210 includes a pixel electrode 212. The thin film transistor 230 is connected to the data line 500 and the scan line 600, but the thin film transistor 230 and the dummy pattern controlling layer 210 are electrically insulated. In the dummy pixel 200, because the pixel electrode 212 of the dummy pattern controlling layer 210 and the thin film transistor 230 are electrically insulated, the pixel electrode 212 is not controlled by the thin film transistor 230. In contrast, the dummy pattern controlling layer 210 is electrically connected to the peripheral wiring layer 300, so that the dummy pattern controlling layer 210 is controlled by the peripheral wiring layer 300. As a result, the peripheral wiring layer 300 controls the portion of the display element layer 20 located above the dummy pixels 200 via the dummy pattern controlling layer 210.

During an inspection process, the inspector can make marks on an edge of the light permeable substrate 100. When the inspector observes that a certain data line 500 malfunctions and causes a portion of the display element layer 20 above the display pixels 400 connected to the malfunctioned data line 500 show an abnormal color, the inspector has to determine which mark corresponds to the display pixels 400. However, because the display pixels 400 and the edge of the light permeable substrate 100 are spaced apart by the dummy pixels 200, it is difficult to precisely determine which mark corresponds to the abnormal display pixels 400. As a result, in some embodiments, the inspector may cut off the electrical connection structure 220 of the dummy pixel 200 in advance, so as to electrically insulate the dummy pixels 200 from the peripheral wiring layer 300. Then, the inspector may conduct the pixel electrode 212 to the thin film transistor 230 by laser welding. Therefore, the data lines 500 control the dummy pattern controlling layers 210 through the thin film transistors 230 (for example, providing display signals to the dummy pattern controlling layers 210). As a result, when a data line 500 malfunctions, a portion of the display element layer 20 above the dummy pattern controlling layer 210, which is connected to the malfunctioned data line 500, shows an abnormal color. Therefore, the inspector is facilitated to determine which mark on the edge of the light permeable substrate 100 corresponds to the abnormal portion of the display element layer 20, thereby assisting to determine which data line 500 malfunctions.

For example, a conductive layer forming a gate electrode, a source electrode and a drain electrode of the thin film transistor 230 is located under the dummy pattern controlling layer 210. This conductive layer and the dummy pattern controlling layer 210 are spaced apart and insulated by an insulating material. During the process for conducting the pixel electrode 212 to the thin film transistor 230, the insulating material under the pixel electrode 212 can be cut out by a laser beam, so that the conductive layer forming the gate electrode of the thin film transistor 230 can be electrically connected to the pixel electrode 212. As a result, the thin film transistor 230 can control the dummy pattern controlling layer 210, so that the signal from the data line 500 can be provided to the pixel electrode 212.

In some embodiments, as shown in FIG. 2, the display pixel 400 includes a display pattern controlling layer 410 and a thin film transistor 430. The display pattern controlling layer 410 includes a pixel electrode 412. The thin film transistor 430 is connected to the data line 500 and the scan line 600. A conductive layer forming a gate electrode of the thin film transistor 430 is electrically connected to the pixel electrode 412 of the display pattern controlling layer 410, so that the thin film transistor 430 can control the display pattern controlling layer 410.

In particular, reference can be made to FIG. 3, which is a schematic cross-sectional view of the thin film transistor array substrate 10 taken along line 3-3 shown in FIG. 2. As shown in FIG. 3, the display pixel 400 further includes a first insulating layer 440, a middle conductive layer 450, a second insulating layer 460 and a bottom conductive layer 470. The bottom conductive layer 470, the second insulating layer 460, the middle conductive layer 450, the first insulating layer 440 and the display pattern controlling layer 410 are sequentially stacked on the light permeable substrate 100. The middle conductive layer 450 is located between the bottom conductive layer 470 and the display pattern controlling layer 410. The bottom conductive layer 470 is electrically connected to the display pattern controlling layer 410. The electric potential of the middle conductive layer 450 can be considered a reference potential, which is different from the electric potential of the bottom conductive layer 470 and the electric potential of the display pattern controlling layer 410. As such, the middle conductive layer 450 and the bottom conductive layer 470 generate a capacitance therebetween, and the middle conductive layer 450 and the display pattern controlling layer 410 generate another capacitance therebetween. The bottom conductive layer 470 includes a gate electrode, and the bottom conductive layer 470 is connected to the scan line 600 (See FIG. 2). The middle conductive layer 450 includes a drain electrode and a source electrode. The middle conductive layer 450 is connected to the data line 500 (See FIG. 2). A semiconductor layer can be included between the bottom conductive layer 470 and the middle conductive layer 450. The semiconductor layer, the gate electrode of the bottom conductive layer 470, and the drain and source electrodes of the middle conductive layer 450 can cooperatively form the thin film transistor 430 (See FIG. 2). The display pattern controlling layer 410 partially passes through the first insulating layer 440 and the second insulating layer 460, and is electrically connected to the bottom conductive layer 470. Therefore, the pixel electrode 412 of the display pattern controlling layer 410 (See FIG. 2) is electrically connected to the gate electrode of the bottom conductive layer 470, thereby being controlled by the thin film transistor 430.

FIG. 4 is a schematic cross-sectional view of the thin film transistor array substrate 10 taken along line 4-4 shown in FIG. 2. As shown in FIG. 4, the dummy pixel 200 includes a first insulating layer 240; a middle conductive layer 250, a second insulating layer 260 and a bottom conductive layer 270. The bottom conductive layer 270, the second insulating layer 260, the middle conductive layer 250, the first insulating layer 240 and the dummy pattern controlling layer 210 are sequentially stacked on the light permeable substrate 100. The bottom conductive layer 270 includes a gate electrode. The bottom conductive layer 270 is connected to the scan line 600 (See FIG. 2). The middle conductive layer 250 includes a drain electrode and a source electrode. The middle conductive layer 250 is connected to the data line 500 (See FIG. 2). A semiconductor layer (not shown) is further included between the bottom conductive layer 270 and the middle conductive layer 250. The semiconductor layer, the gate electrode of the bottom conductive layer 270, and the drain and source electrodes of the middle conductive layer 250 cooperatively form the thin film transistor 230 (See FIG. 2). The first insulating layer 240 separates the dummy pattern controlling layer 210 from the middle conductive layer 250 and the bottom conductive layer 270 completely, so that the dummy pattern controlling layer 210 is electrically insulated from the thin film transistor 230. Therefore, the dummy pattern controlling layer 210 is not controlled by the thin film transistor 230. Instead, the dummy pattern controlling layer 210 is controlled by the peripheral wiring layer 300 (See FIG. 2). In some embodiments, during the inspection process, as shown in FIGS. 2 and 4, the electrical connection structure 220 can be cut off in order to insulate the dummy pattern controlling layer 210 from the peripheral wiring layer 300. Then, the dummy pattern controlling layer 210 can be electrically connected to the bottom conductive layer 270 by laser welding, so that the dummy pattern controlling layer 210 can be electrically connected to the gate electrode of the bottom conductive layer 270, thereby allowing the dummy pattern controlling layer 210 to be controlled by the thin film transistor 230 for receiving the signal from the data line 500.

In some embodiments, the material forming the dummy pattern controlling layer 210, the material forming the middle conductive layer 250, and the material forming the bottom conductive layer 270 can be, but not limited to, metal. Similarly, in some embodiments, the material forming the display pattern controlling layer 410, the material forming the middle conductive layer 450, and the material forming the bottom conductive layer 270 can be, but not limited to, metal. In some embodiments, the material forming the electrical connection structure 220 can be, but not limited to, metal.

Figure 5:
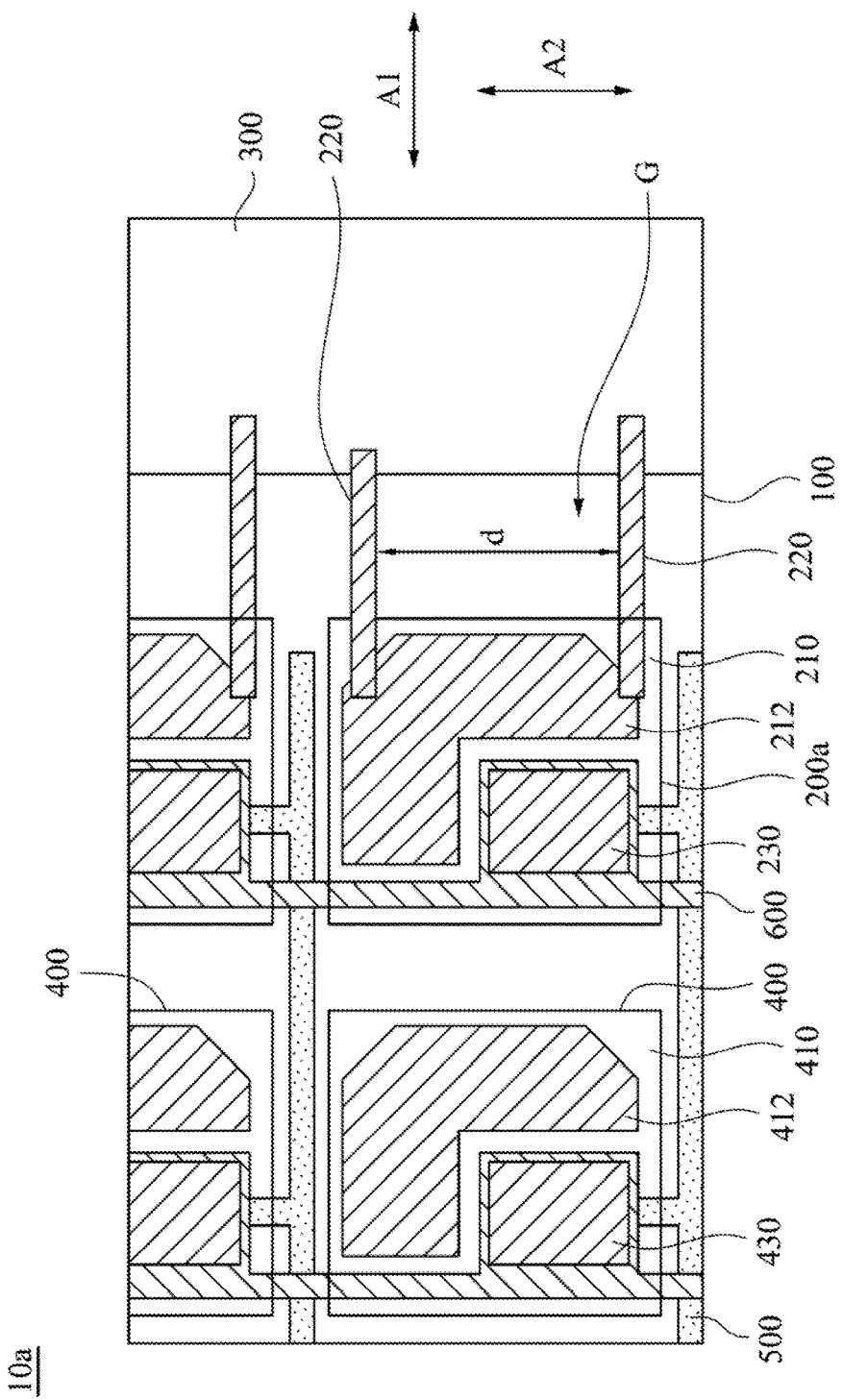
FIG. 5 is a schematic fragmentary top view of a thin film transistor array substrate in accordance with another embodiment of the present invention.

FIG. 5 is a schematic fragmentary top view of a thin film transistor array substrate 10a in accordance with another embodiment of the present invention. As shown in FIG. 5, the main difference between this embodiment and the thin film transistor array substrate 10 shown in FIG. 2 is that, in the dummy pixel 200a, the number of the electrical connection structure 220 is plural (two), so as to apply a stronger electric field to the display element layer 20 thereon (See FIG. 1). More particular, if the dummy pixel 200a has an unduly large size, such that the distance between the electrical connection structures 220 of two adjacent dummy pixels 200a is unduly long, and the electric field of the electrical connection structures 220 may be not strong enough to control all microcapsules 21 (See FIG. 1) above the gap G. However, when one single dummy pixel 200a includes plural electrical connection structures 220 which all pass through the gap G, those electrical connection structures 220 enhance the electric field in the gap G, so as to improve the control of the microcapsules 21 above the gap G.

In particular, the peripheral wiring layer 300 and the dummy pattern controlling layers 210 are arranged along a first direction A1. The electrical connection structures 220 are arranged along a second direction A2. The first direction A1 is substantially perpendicular to the second direction A2. By such an arrangement, the lateral electric field generated by the electrical connection structures 220 along the second direction A2 can make the electric field strength on the gap G more uniform along the second direction A2.

In some embodiments, two adjacent electrical connection structures 220 are spaced apart by an interval d along the second direction A2. The interval d is smaller than or equal to 20 µm. By such a dimension design, the lateral electric field that the electrical connection structures 220 generate along the second direction A2 has higher strength, so as to effectively control the microcapsules 21 above the gap G.

In this embodiment, the electrical connection structures 220 are all strip-shaped structures, and the strip shaped structures have lengthwise directions parallel to each other and parallel to the first direction A1. Further, these strip-shaped structures are arranged substantially along the second direction A2. For example, the electrical connection structures 220 may be metal bars substantially parallel to each other. These metal bars can be used to apply an electric field that is strong enough to control the microcapsules 21 above the gap G. Moreover, the inspector can still observe whether the microcapsules 21 are abnormal through the gap between the metal bars.

Figure 6:
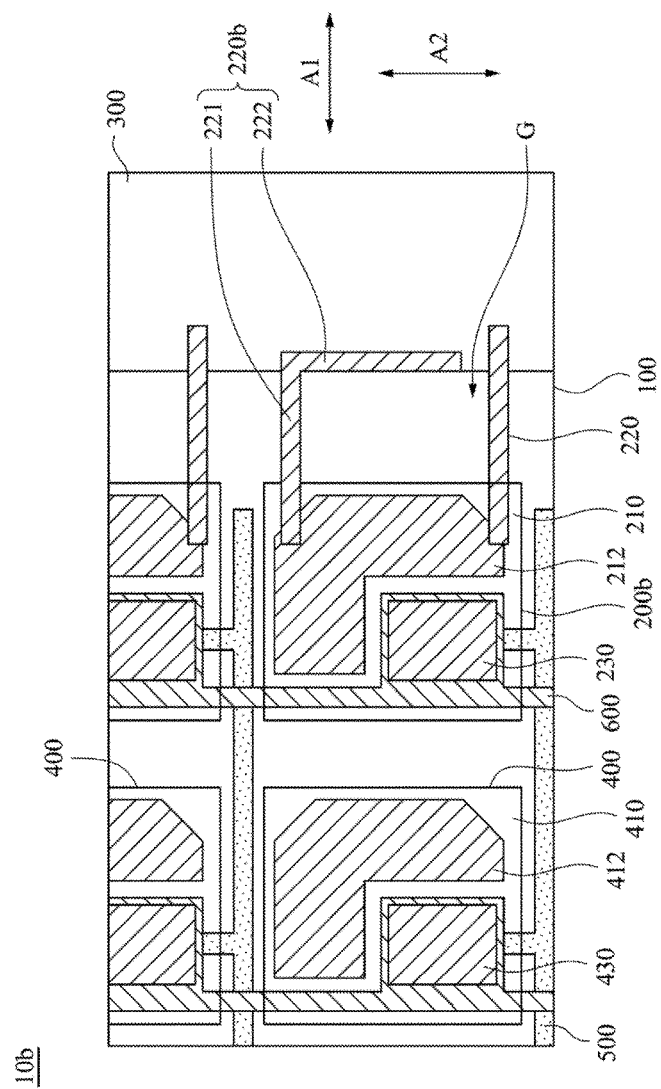
FIG. 6 is a schematic fragmentary top view of a thin film transistor array substrate in accordance with another embodiment of the present invention.

FIG. 6 is a schematic fragmentary top view of a thin film transistor array substrate 10b in accordance with another embodiment of the present invention. As shown in FIG. 6, the main difference between this embodiment and the thin film transistor array substrate 10a is that, the electrical connection structure 220b of the dummy pixel 200b has a shape different from the shape of the foregoing electrical connection structure 220. In particular, the electrical connection structure 220b includes a first electrical conductor 221 and a second electrical conductor 222. The first electrical conductor 221 and the second electrical conductor 222 are connected to each other. A lengthwise direction of the first electrical conductor 221 is substantially parallel to the first direction A1. A lengthwise direction of the second electrical conductor 222 is substantially parallel to the second direction A2.

When the electrical connection structure 220b is applied with a voltage, the first electrical conductor 221 applies a lateral electric field along the second direction A2, and the second electrical conductor 222 applies a lateral electric field along the first direction A1. As a result, the second connection structure 220b makes the electric field strength in the gap G more uniform, so as to improve the control of the microcapsules 21 (See FIG. 1) above the gap G.

In this embodiment, as shown in FIG. 6, the second electrical conductor 222 can be disposed on the peripheral wiring layer 300, rather than in the gap G. Therefore the second electrical conductor 222 can enhance the electric field strength in the gap G and make it uniform without shielding the gap G.

In this embodiment, as shown in FIG. 6, the electrical connection structure 220b is an L-shaped structure. More particularly, the first electrical conductor 221 and the second electrical conductor 222 both are strip-shaped structures. The second electrical conductor 222 is connected to the end of the first electrical conductor 221, and the lengthwise directions of the first electrical conductor 221 and the second electrical conductor 220 are perpendicular to each other, thereby cooperatively forming the L-shaped structure. For example, the first electrical conductor 221 and the second electrical conductor 222 can be, but not limited to, metal bars.

Figure 7:
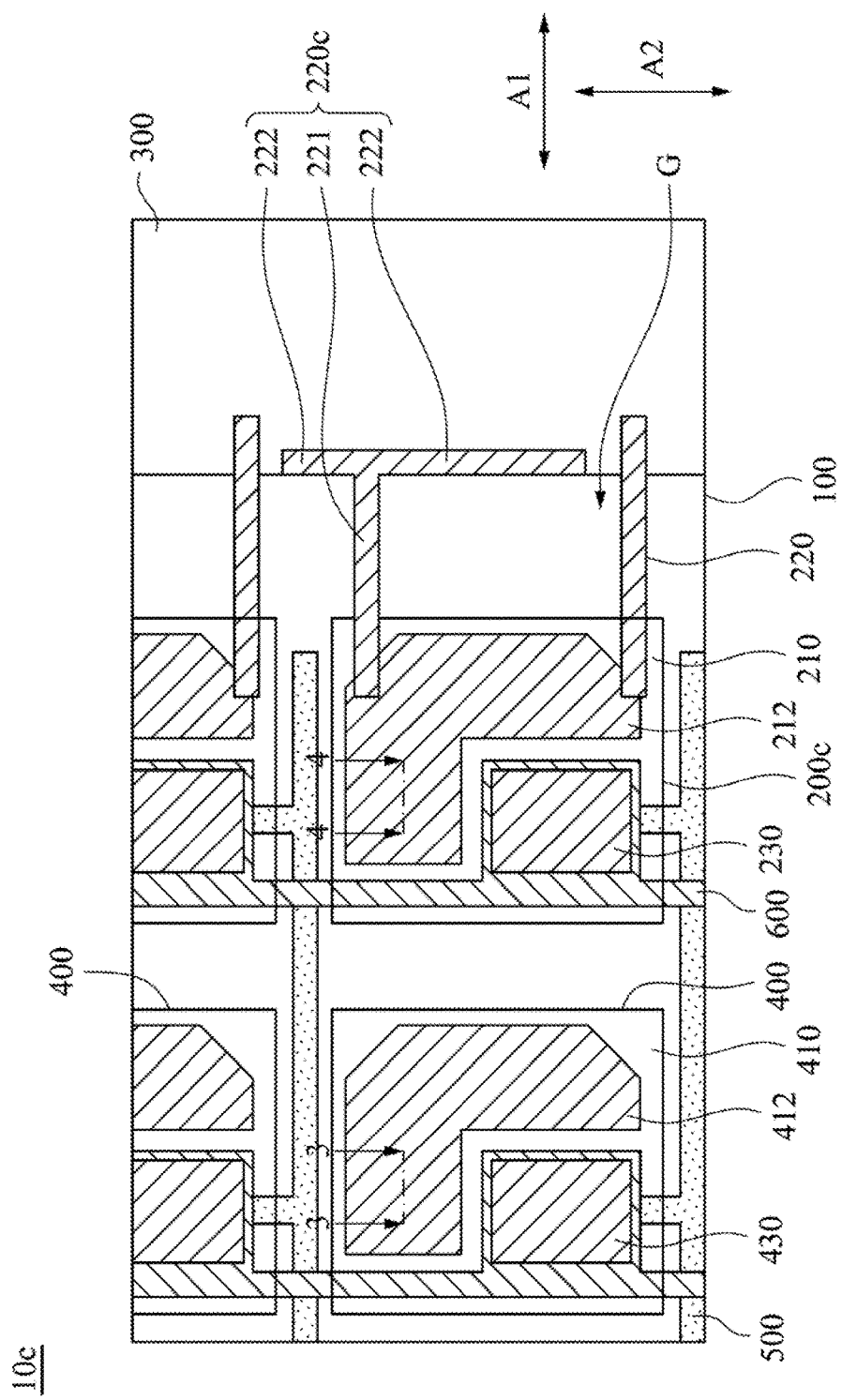
FIG. 7 is a schematic fragmentary top view of a thin film transistor array substrate in accordance with another embodiment of the present invention.

FIG. 7 is a schematic fragmentary top view of a thin film transistor array substrate 10c in accordance with another embodiment of the present invention. As shown in FIG. 7, the main difference between this embodiment and the thin film transistor array substrate 10b is that, the electrical connection structure 220c of the dummy pixel 200c has a shape different from the shape of the foregoing electrical connection structure 220b. In particular, the electrical connection structure 220c is a T-shaped structure. More particularly, the electrical connection structure 220c includes a first electrical conductor 221 and two second electrical conductor 222. One second electrical conductor 222 is perpendicularly connected to the upper side of the first electrical conductor 221, and another second electrical conductor 222 is perpendicularly connected to the lower side of the first electrical conductor 221. As such, the first electrical conductor 221 and these two second electrical conductor 222 cooperatively form the T-shaped structure.

In such a configuration, the T-shaped electrical connection structure 220c employs two second electrical conductors 222 to enhance the lateral electric field strength along the first direction A1, so as to make the electric field strength in the gap G more uniform, thereby improving the control of the microcapsules 21 (See FIG. 1) above the gap G.

In this embodiment, as shown in FIG. 7, these two second electrical conductors 222 are both disposed on the peripheral wiring layer 300, and are not in the gap G. Therefore, these two second electrical conductors 222 can enhance the electric field strength in the gap G and make it uniform without shielding the gap G.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display apparatus, comprising:
   a light permeable substrate;
   a plurality of dummy pixels disposed on the light permeable substrate, each of the dummy pixels comprising a thin film transistor and a dummy pattern controlling layer over the thin film transistor;
   a peripheral wiring layer disposed on the light permeable substrate and configured to apply voltages having the same polarity to the dummy pattern controlling layers, wherein the peripheral wiring layer is electrically insulated from the thin film transistor of one of the dummy pixels and is electrically connected to the dummy pattern controlling layer of said one of the dummy pixels; and
   a display element layer covering the light permeable substrate and the dummy pixels,
   wherein the peripheral wiring layer and the dummy pattern controlling layers are spaced apart by a gap, and the gap allows light to be reflected from the display element layer to the light permeable substrate.

2. The display apparatus of claim 1, wherein one of the dummy pixels comprises at least one electrical connection structure passing through the gap and connecting one of the dummy pattern controlling layer to the peripheral wiring layer.

3. The display apparatus of claim 2, wherein the peripheral wiring layer and the dummy pattern controlling layers are arranged along a first direction, wherein the number of the at least one electrical connection structure is plural, and the electrical connection structures are arranged along a second direction, wherein the first direction is substantially perpendicular to the second direction.

4. The display apparatus of claim 3, wherein two adjacent ones of the electrical connection structures are spaced apart by an interval, and the interval is smaller than or equal to 20 μm.

5. The display apparatus of claim 3, wherein one of the electrical connection structures comprises a first electrical conductor and at least one second electrical conductor, wherein a lengthwise direction of the first electrical conductor is substantially parallel to the first direction, and a lengthwise direction of the second electrical conductor is substantially parallel to the second direction.

6. The display apparatus of claim 2, wherein the electrical connection structure is an L-shaped structure.

7. The display apparatus of claim 2, wherein the electrical connection structure is a T-shaped structure.

8. The display apparatus of claim 2, wherein the electrical connection structure exposes a portion of the gap.

9. The display apparatus of claim 8, wherein a portion of the display element layer is located above the gap and controlled by an electric field of the electrical connection structure.

10. The display apparatus of claim 1, further comprising a plurality of display pixels disposed on the light permeable substrate and covered by the display element layer, the dummy pixels surrounding the display pixels, and at least two of the display pixels are applied with voltages having different polarities.

11. The display apparatus of claim 1, wherein the thin film transistor and the dummy pattern controlling layer of said one of the dummy pixels are electrically insulated, wherein a portion of the display element layer located above the dummy pixel is controlled by an electric field of the dummy pattern controlling layer.

* * * * *